(12) United States Patent
Mazula

(10) Patent No.: US 10,127,333 B2
(45) Date of Patent: Nov. 13, 2018

(54) EMBEDDED FREQUENCY BASED SEARCH AND 3D GRAPHICAL DATA PROCESSING

(71) Applicant: Dassault Systemes, Velizy Villacoublay (FR)

(72) Inventor: Nelia Gloria Mazula, Houston, TX (US)

(73) Assignee: Dassault Systemes, Velizy Villacoublay (FR)

( * ) Notice: Subject to any disclaimer, the term of this patent is extended or adjusted under 35 U.S.C. 154(b) by 296 days.

(21) Appl. No.: 14/984,765

(22) Filed: Dec. 30, 2015

(65) Prior Publication Data

US 2017/0193132 A1  Jul. 6, 2017

(51) Int. Cl.
*G06F 17/50* (2006.01)
*G06F 17/30* (2006.01)

(52) U.S. Cl.
CPC .............. *G06F 17/50* (2013.01); *G06F 17/30* (2013.01)

(58) Field of Classification Search
None
See application file for complete search history.

(56) References Cited

U.S. PATENT DOCUMENTS

| 10,049,479 | B2 | 8/2018 | Mazula | |
|---|---|---|---|---|
| 2004/0249809 | A1* | 12/2004 | Ramani | G06F 17/30259 |
| 2006/0067573 | A1 | 3/2006 | Parr et al. | |
| 2009/0222446 | A1* | 9/2009 | Goldschmidt | G06K 9/52 |
| 2010/0046704 | A1 | 2/2010 | Song et al. | |
| 2011/0015901 | A1 | 1/2011 | Winterberg et al. | |
| 2011/0064282 | A1 | 3/2011 | Abramovich et al. | |
| 2011/0129124 | A1 | 6/2011 | Givon | |
| 2012/0170821 | A1 | 7/2012 | Zug et al. | |
| 2013/0185024 | A1* | 7/2013 | Mahasenan | H04W 16/18 703/1 |

(Continued)

FOREIGN PATENT DOCUMENTS

| EP | 2892028 A2 | 7/2015 |
|---|---|---|
| EP | 2892028 A3 | 11/2015 |

(Continued)

OTHER PUBLICATIONS

Blümel, Ina, et al., PROBADO3D—Indexing and Searching 3D CAD Databases: Supporting Planning through Content-Based Indexing and 3D Shape Retrieval, International Conference on Design & Decision Support Systems in Architecture and Urban Planning, pp. 1-7 (Jul. 22, 2010).

(Continued)

*Primary Examiner* — Syed A Roni
(74) *Attorney, Agent, or Firm* — Hamilton, Brook, Smith & Reynolds, P.C.

(57) ABSTRACT

An embodiment provides a method of modifying a computer aided design (CAD) model. Such an embodiment associates metadata with a CAD model. In turn, the metadata is defined which includes providing the metadata in the form of a signal with one or more frequency characteristics that correspond to one or more respective characteristics of the CAD model. These frequencies can be used as part of mapping and/or processing algorithms in labeling or identifying unknown information about an environment. In an embodiment, the metadata may include graphical descriptions of the frequency such as a vector or other image based files.

20 Claims, 4 Drawing Sheets

(56) References Cited

U.S. PATENT DOCUMENTS

| | | |
|---|---|---|
| 2014/0210856 A1 | 7/2014 | Finn et al. |
| 2014/0350395 A1 | 11/2014 | Shachaf et al. |
| 2015/0002639 A1 | 1/2015 | Kwon et al. |
| 2015/0197016 A1 | 7/2015 | Krenik |
| 2015/0213059 A1 | 7/2015 | Ely |
| 2015/0279087 A1 | 10/2015 | Myers et al. |
| 2015/0294511 A1 | 10/2015 | Nishioka et al. |
| 2016/0047903 A1 | 2/2016 | Dussan |
| 2017/0007368 A1 | 1/2017 | Boronkay |
| 2017/0100088 A1 | 4/2017 | Simon |
| 2017/0193278 A1 | 7/2017 | Mazula |
| 2017/0193696 A1 | 7/2017 | Mazula |

FOREIGN PATENT DOCUMENTS

| | | |
|---|---|---|
| WO | WO 2006/097926 A2 | 9/2006 |
| WO | WO 2010/009840 A1 | 1/2010 |

OTHER PUBLICATIONS

Extended European Search Report for European Application No. 16207197.1 dated May 10, 2017.

Extended European Search Report for European Application No. 16207198.9 dated May 11, 2017.

Funkhouser, Thomas, et al., "A Search Engine for 3D Models", ACM Transactions on Graphics, 22(1): 83-105 (Jan. 1, 2003).

Tangelder, Johan W. H. and Veltkamp, Remco C.,"A survey of content based 3D shape retrieval methods", Multimedia Tools and Applications, Kluwer Academic Publishers, 39(3): 441-471 (Dec. 8, 2007).

Extended European Search Report for European Application No. 16207196.3 dated Jun. 8, 2017 entitled "Density Based Graphical Mapping".

Kris Demarsin, "Extraction of Closed Feature Lines from Point Clouds Based on Graph Theory", Retrieved from the Internet: URL:http://www.cs.kuleuven.be/publicaties/doctoraten/tw/TW2009_01.pdf, pp. 1-136, Jan. 1, 2009.

Son, H. et al., "Knowledge-Based Approach for 3D Reconstruction of As-Built Industrial Plant Models From Laser-Scan Data", 2013 Proceedings of the $30^{th}$ International Symposium on Automation and Robotics in Construction, pp. 1-9, Aug. 11, 2013.

Autodesk, "Cloud Services," http://www.autodesk.com/360-cloud, 2014.

Te Gao, "Consructing a Complete and Accurate As-Build BIM Based on an As-Designed BIM and Progressive Laser Scans," Carnegie Mellon University 2014.

Kim, et al., "Automated Construction Progress Measurement Using a 4D Building Information Model and 3D Data," Dept. of Architectural Eng., Republic of Korea, Dec. 2012.

"Point Cloud," Wikipedia, May 19, 2015, Retrieved from https://en.wikipedia.org/wiki/Point_cloud on Apr. 6, 2016.

\* cited by examiner

EMBEDDED FREQUENCY BASED SEARCH AND 3D GRAPHICAL DATA PROCESSING

RELATED APPLICATIONS

This application is related to "DENSITY BASED GRAPHICAL MAPPING" by Nelia Gloria Mazula, Ser. No. 14/983,878 and "3D TO 2D REIMAGING FOR SEARCH" by Nelia Gloria Mazula, Ser. No. 14/984,412. The entire teachings of the above applications are incorporated herein by reference.

BACKGROUND

Embodiments generally relate to the field of computer programs and systems, and specifically to the field of computer aided design (CAD), computer-aided engineering, and modeling.

A number of systems and programs are offered on the market for the design of parts or assemblies of parts. These so called CAD systems allow a user to construct and manipulate complex three-dimensional models of objects or assemblies of objects. CAD systems thus provide a representation of modeled objects using edges or lines, in certain cases with faces. Lines, edges, faces, or polygons may be represented in various manners, e.g., non-uniform rational basis-splines (NURBS).

These CAD systems manage parts or assemblies of parts of modeled objects, which are mainly specifications of geometry. In particular, CAD files contain specifications, from which geometry is generated. From geometry, a representation is generated. Specifications, geometry, and representations may be stored in a single CAD file or multiple CAD files. CAD systems include graphic tools for representing the modeled objects to the designers; these tools are dedicated to the display of complex objects. For example, an assembly may contain thousands of parts. A CAD system can be used to manage models of objects, which are stored in electronic files.

SUMMARY OF THE INVENTION

CAD models and the associated metadata or met information contain a vast array of information. Thus, methods and systems are needed to format the metadata or metainformation to efficiently include this vast array of CAD model data. The terms metadata and metainformation are used interchangeably herein. Such methods and systems can be used in any application utilizing CAD models. Further, embodiments of the present invention are particularly advantageous when used in conjunction with methodologies for CAD model re-design and maintenance in the fields of processing facilities, plants, and equipment because of the complexity and scale of such models.

In a computer implemented embodiment of the present invention, a CAD model is modified by a processor by associating metadata with a CAD model in memory communicatively coupled to the processor. Such an embodiment further defines the metadata which includes providing the metadata in the form of a signal with one or more frequency characteristics corresponding to one or more respective characteristics of the CAD model.

According to an embodiment of such a method, the CAD model represents a plurality of real-world objects and the one or more frequency characteristics correspond to the plurality of real-world objects. In an embodiment, the one or more frequency characteristics are unique to each respective characteristic of the CAD model. According to yet another embodiment, the one or more frequency characteristics correspond to one or more respective unknown characteristics of the CAD model. In an embodiment, the one or more characteristics of the CAD model comprise at least one of: an object type, an object material, an object size, an object location, an object orientation, an object sub-component, and a sub-system comprising an object.

An alternative embodiment of the method further comprises storing, in a database coupled to the processor, a mapping between the one or more frequency characteristics and the corresponding one or more characteristics of the CAD model. Yet another embodiment further comprises receiving search input from a user, the search input representative of a desired frequency and by the processor, searching based on the desired frequency to identify a given characteristic of the one or more characteristics of the CAD model.

Another embodiment of the present invention is directed to a computer system for modifying a CAD model. Such a computer system comprises a processor and memory with computer code instructions stored thereon where the processor and the memory with the computer code instructions are configured to cause the system to implement the various embodiments described herein. In one such embodiment, the processor and the memory, with the computer code instructions, are configured to cause the system to associate metadata with a CAD model in the memory. Further, in such an embodiment, the processor and the memory, with the computer code instructions further cause the system to define the metadata, which includes providing the metadata in the form of a signal with one or more frequency characteristics corresponding to one or more respective characteristics of the CAD model. In an embodiment, the metadata may include graphical descriptions, such as a vector or other image based files, of the signal/frequency characteristics. According to a computer system embodiment, the CAD model represents a plurality of real-world objects and the one or more frequency characteristics correspond to the plurality of real-world objects. In yet another example embodiment, the one or more frequency characteristics are unique to each respective characteristic of the CAD model.

In an example computer system embodiment, the processor and the memory, with the computer code instructions are further configured to cause the system to store, in a database communicatively coupled to the processor, a mapping between the one or more frequency characteristics and the corresponding one or more characteristics of the CAD model. In another embodiment, the processor and the memory, with the computer code instructions, are configured to cause the system to implement, based on a desired frequency provided by a user, searching via the desired frequency to identify a given characteristic of the one or more characteristics of the CAD model.

According to an embodiment of the computer system, the one or more characteristics of the CAD model comprise at least one of: an object type, an object material, an object size, an object location, an object orientation, an object sub-component, and a sub-system comprising an object. In an alternative embodiment, the one or more frequency characteristics correspond to one or more respective unknown characteristics of the CAD model.

Another embodiment of the present invention is directed to a cloud computing implementation for modifying a CAD model. Such an embodiment is directed to a computer program product executed by a server in communication across a network with one or more clients, where the computer program product comprises a computer readable medium. In such an embodiment, the computer readable medium comprises program instructions which, when executed by a processor, causes the processor to associate metadata with a CAD model in memory communicatively coupled to the processor. Further, in such an embodiment, the program instructions, when executed by the processor, further cause the processor to define the metadata, which includes providing the metadata in the form of a signal with one or more frequency characteristics corresponding to one or more respective characteristics of the CAD model.

BRIEF DESCRIPTION OF THE DRAWINGS

The foregoing will be apparent from the following more particular description of example embodiments of the invention, as illustrated in the accompanying drawings in which like reference characters refer to the same parts throughout the different views. The drawings are not necessarily to scale, emphasis instead being placed upon illustrating embodiments of the present invention.

DETAILED DESCRIPTION OF THE INVENTION

Figure 1:
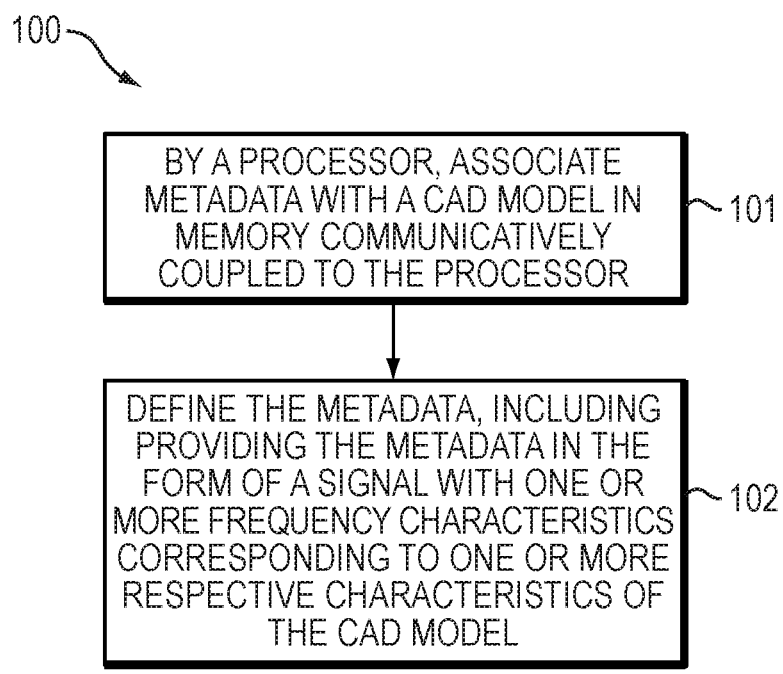
FIG. 1 is a flowchart of a method for modifying a CAD model according to an embodiment.

A description of example embodiments of the invention follows.

The teachings of all patents, published applications and references cited herein are incorporated by reference in their entirety.

Currently, when environments and objects, such a brownfields and chemical plants are laser scanned or reimaged, there is no associated metadata to describe the object/environment that has been reimaged. For example, laser scan data of a pump is not identified as a pump. Some techniques utilize manual, e.g., human, intervention to identify objects or to map objects in the environment. Such techniques can store the data in an existing repository or database. CAD models, such as chemical processing plant models, can contain thousands of objects and hundreds or even thousands of object types and configurations. With these complex CAD models, tasks such as searching, leveraging commonly occurring objects, and any automated techniques, are complicated by the size and complexity of the CAD model as well as the fact that the model is in 3D and the objects in the model may not have sufficient identifying metadata.

Currently, there are no search mechanisms to leverage, configure, or map common repeatable logic based occurrences in CAD models. For example, there are no methods to implement logic to automate identifying data as representing a particular object. Embodiments of the present invention can be leveraged to help facilitate such methods, such as those described in "DENSITY BASED GRAPHICAL MAPPING" by Nelia Gloria Mazula, Ser. No. 14/983,878 and "3D TO 2D REIMAGING FOR SEARCH" by Nelia Gloria Mazula, Ser. No. 14/984,412, the contents of which are incorporated herein by reference.

In an example embodiment of the present invention, frequencies are mapped to the objects of a CAD model rather than words. Using frequency or wavelength is a more robust and flexible technique and can be used to describe smaller, more nuanced differences in objects and combinations of objects represented by CAD models. For instance, in an embodiment, a particular frequency corresponds to a specific valve type and small alterations of this frequency correspond to various characteristics of the valve, such as the valve size, valve direction, and number of bolts on the valve. Further, in an embodiment, frequencies of objects can be combined to identify systems of objects and/or sub-systems. In such an embodiment, the different frequency data may pertain to individual objects of a system and a combination of the frequency data may correspond to an environment, e.g. processing plant, or sub-system thereof. These models with associated frequency metadata can be leveraged in further embodiments to recreate or reimage an environment as well as track and map logic maps pertaining to CAD models and environments.

By embedding frequency data as the metadata of a CAD model to describe objects represented by the CAD model more information types can be easily embedded. The frequency data can also embed questions or indicate a lack of information and missing information in addition to embedding characteristics that are known about the model. In the example of a valve, for instance, the frequency information could indicate that it is known that the CAD model is a valve, the type of valve is unknown, the valve direction is known, and the valve material is unknown.

In an embodiment, unknown information corresponds to the same wavelength or frequency for all objects of the CAD model. For example, a 1 hertz signal component may indicate that the material of the object is unknown. All objects, where the material of the object is unknown will similarly have a 1 hertz signal component. In addition to using signal frequency, the number or size of the signal wavelength can also be varied to indicate characteristics of a CAD model.

Embodiments can also search for commonalities using these frequency characteristics and can further utilize the frequency type meta-data when re-imaging an environment. This metadata can also be used to identify logic, rules, or similarities amongst CAD models.

FIG. 1 is a flowchart of a method 100 for modifying a CAD model according to an embodiment of the present invention. The method 100 begins at step 101 by associating metadata with a CAD model. In a computer implemented embodiment of the method 100, a processor associates the metadata with the CAD model in memory that is communicatively coupled to the processor. According to an embodiment, associating the metadata at step 101 stores the metadata as part of the CAD model. In another embodiment, the metadata is associated with the CAD model at step 101 through a link, such as a pointer, that indicates the location of the metadata that is associated with the CAD model.

The method 100 continues at step 102 and defines the metadata. In an embodiment, defining the metadata at step 102 includes providing the metadata in the form of a signal with one or more frequency characteristics which correspond to one or more characteristics of the CAD model. In other words, in such an example embodiment, the metadata is a signal and particular characteristics of the signal, e.g. frequency, wavelength, and amplitude, correspond to characteristics of the CAD model, such as object type and object material. According to an embodiment, providing the metadata comprises generating a signal with the particular frequency characteristics that correspond to the CAD model and the properties thereof.

In an embodiment, the metadata may include graphical descriptions, e.g., vector or other image based files, of the frequency characteristics/signal. In an embodiment where associating the metadata at step 101 includes storing the metadata, the metadata may be stored at any point through any means known in the art. According to an embodiment, the signal or frequency can be stored graphically as a vector or other image file or as binary data. In such an example embodiment, the binary data or graphical object can describe the frequency characteristics/signal. Further, in an example embodiment, the metadata may be stored in a database of text files where the graphical object or binary data has a unique identifier used to map the frequency characteristics to the CAD model. Any frequency methodologies can be used to describe the objects, including frequency language unique the CAD model or music frequencies that can be converted into musical notes and stored in the same way. These frequencies in the CAD model act like a human sense to provide the graphical environment with another methodology to be identified and to identify information within the environment itself.

According to an embodiment of the method 100, the CAD model represents a plurality of real-world objects and the one or more frequency characteristics correspond to the plurality of real-world objects. To illustrate, consider an example where the CAD model represents a chemical processing plant that includes a pump, a valve, and a section of pipe. In such an example embodiment, the metadata (in the form of a signal) has respective frequency characteristics that correspond to the pump, valve, and pipe. In yet another embodiment, the frequency characteristics of the metadata signal are unique to each respective characteristic of the CAD model. Returning to the aforementioned chemical processing plant, in such an embodiment, the metadata would have a unique frequency characteristic for each of the pump, valve, and pipe.

According to an embodiment of the method 100, the characteristics of the signal may correspond to any characteristics of the CAD model known in the art. Example CAD model characteristics include: an object type, an object material, an object size, an object location, an object orientation, an object sub-component, and a sub-system comprising the object. In an alternative embodiment, the metadata signal further indicates properties of the CAD model that are unknown.

An embodiment of the method 100 further includes storing a mapping between the one or more frequency characteristics and the corresponding one or more characteristics of the CAD model in a database. In other words, such an embodiment stores the meaning of the frequency characteristics. For instance, it may be stored that a 1 hertz signal indicates that the associated CAD model is a valve. An alternative embodiment of the method 100 needs no such mapping and the meanings of the various frequency characteristics are encoded in the metadata signal itself.

Yet another embodiment of the method 100 uses the metadata to facilitate searching for CAD models or characteristics thereof. Such an embodiment includes receiving search input from a user where the search input represents a desired frequency. In turn, a given characteristic of the CAD model is identified as corresponding to the desired frequency. In another embodiment, the search may be performed across a library or libraries of CAD models and such a search may return all CAD models with metadata that has a frequency characteristic that corresponds to the desired frequency.

While the method 100 is primarily described as providing the metadata in the form of a signal with one or more frequency characteristics that correspond to one or more characteristics of the CAD model, embodiments of the method 100 are not so limited. Embodiments may utilize any signal characteristics, such as frequency, period, amplitude, and wavelength, amongst others, to indicate characteristics of the CAD model.

In addition to modifying CAD models to include a vast array of information, embodiments can also be leveraged to find similarities between CAD models, manage re-imaging, and manage complex metadata descriptions. Such methodologies can be particularly useful to keep CAD models up to date which can improve facilities engineering decision making. When changes are made to an environment/complex object, for example, a chemical processing facility, most updates are done in a modular way on two-dimensional (2D) or smaller 3D models without updating the larger more complex CAD model. Laser scanning the environment/object for instance, does not provide a CAD solution to resolve this problem and still requires re-engineering of the specific areas of interest. Embodiments of the present invention can be used in conjunction with the methods and systems described in "DENSITY BASED GRAPHICAL MAPPING" by Nelia Gloria Mazula, Ser. No. 14/983,878 and "3D TO 2D REIMAGING FOR SEARCH" by Nelia Gloria Mazula, Ser. No. 14/984,412 to solve these problems.

Figure 2:
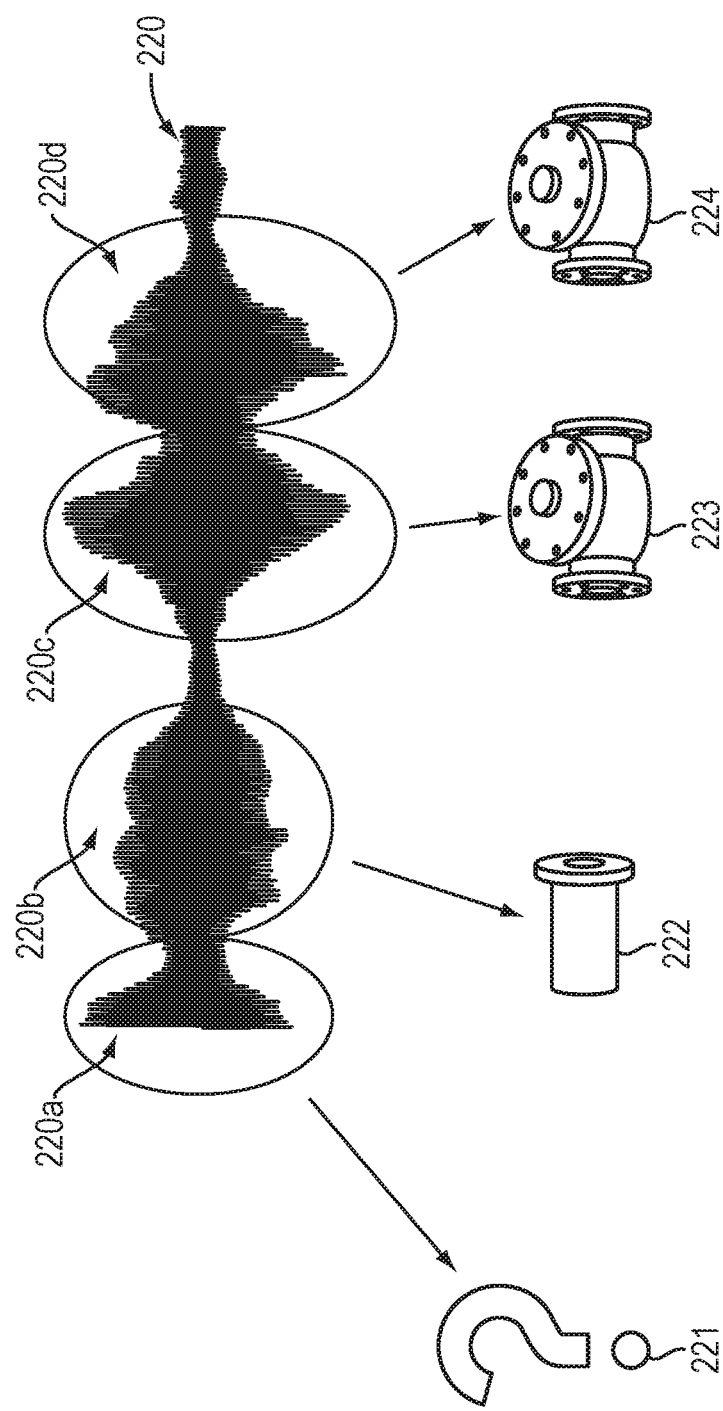
FIG. 2 depicts metadata for a CAD model and associated components of the CAD model according to principles of an embodiment.

FIG. 2 depicts the example metadata 220 that may be used in an embodiment of the present invention. In FIG. 2 the various signal components 220a-d have been combined to form the complete signal 220. According to an embodiment, this indicates that the CAD models that are associated with the metadata 220 are somehow related. For instance, this may indicate that the objects belong to a sub-assembly and/or are from a given environment, amongst other examples. Portions of the metadata 220 correspond to various CAD models or characteristics of CAD models. For instance, the signal portion 220a is mapped to an unidentified object 221, the signal portion 220b is mapped to a pipe 222 and the signal portions 220c and 220d map to the valves 223 and 224, respectively. In the metadata 220 various changes are made to indicate the various characteristics of the objects 221-224. For instance, there are slight variations in the signal portions 220c and 220d which represent the valves 223 and 224. The differences in the signals 220c and 220d may indicate, for example, that the valves are the same valve type but different sizes and made from different materials.

According to an embodiment of the present invention, metadata such as the metadata 220 and/or a description of the metadata can be stored in a database. Further, the metadata curves can be used to find information, map information for re-imaging, and/or identify logic rules with 3D models.

Figure 3:
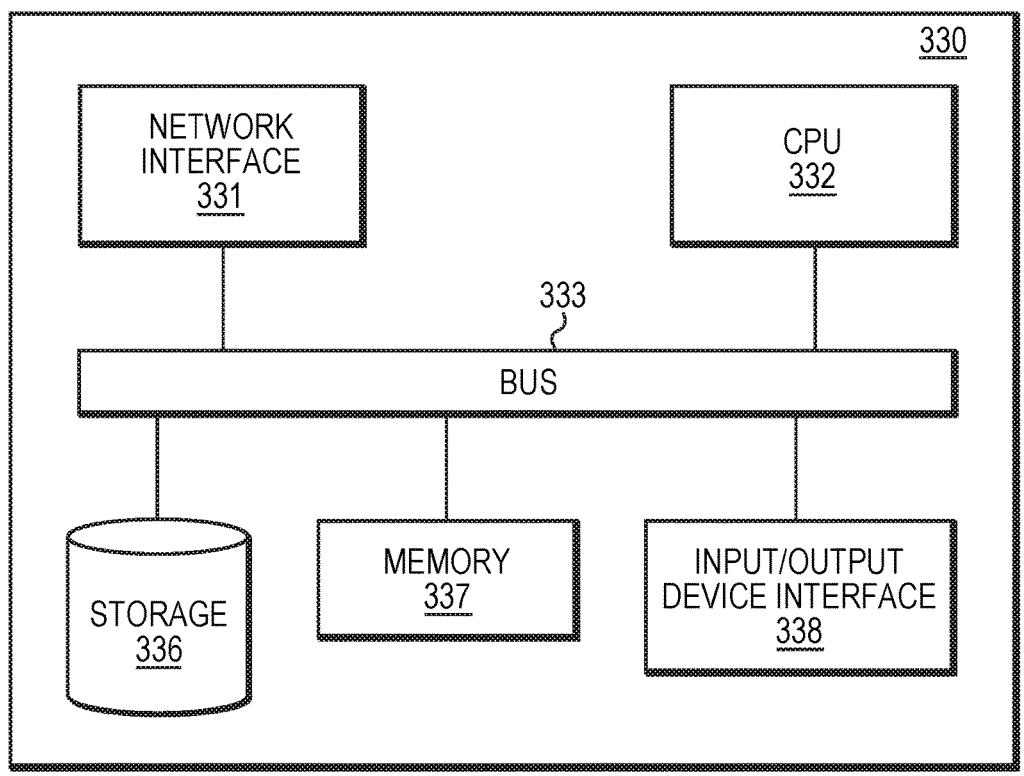
FIG. 3 is a simplified block diagram of a computer system for modifying a CAD model according to an embodiment.

FIG. 3 is a simplified block diagram of a computer-based system 330 that may be used to modify a CAD model according to an embodiment of the present invention. The system 330 comprises a bus 333. The bus 333 serves as an interconnect between the various components of the system 330. Connected to the bus 333 is an input/output device interface 338 for connecting various input and output devices such as a keyboard, mouse, display, speakers, etc. to the system 330. A central processing unit (CPU) 332 is connected to the bus 333 and provides for the execution of computer instructions. Memory 337 provides volatile storage for data used for carrying out computer instructions. Storage 336 provides non-volatile storage for software instructions, such as an operating system (not shown). The system 330 also comprises a network interface 331 for connecting to any variety of networks known in the art, including wide area networks (WANs) and local area networks (LANs).

It should be understood that the example embodiments described herein may be implemented in many different ways. In some instances, the various methods and machines described herein may each be implemented by a physical, virtual, or hybrid general purpose computer, such as the computer system 330, or a computer network environment such as the computer environment 440, described herein below in relation to FIG. 4. The computer system 330 may be transformed into the machines that execute the methods (e.g. 100) described herein, for example, by loading software instructions into either memory 337 or non-volatile storage 336 for execution by the CPU 332. One of ordinary skill in the art should further understand that the system 330 and its various components may be configured to carry out any embodiments of the present invention described herein. Further, the system 330 may implement the various embodiments described herein utilizing any combination of hardware, software, and firmware modules operatively coupled, internally, or externally, to the system 330.

Figure 4:
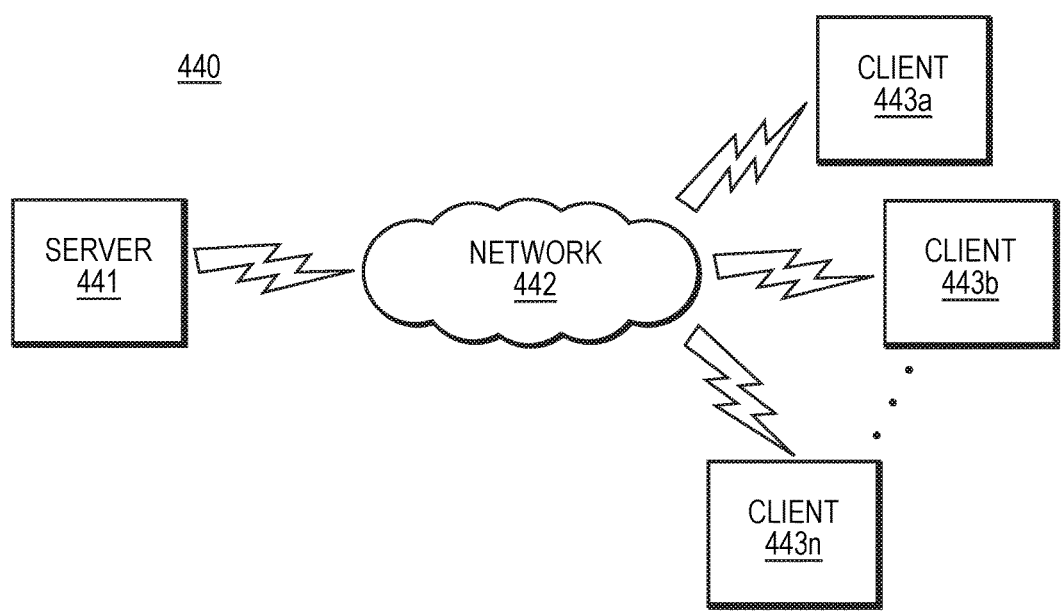
FIG. 4 is a simplified computer network environment in which an embodiment of the present invention may be implemented.

FIG. 4 illustrates a computer network environment 440 in which an embodiment of the present invention may be implemented. In the computer network environment 440, the server 441 is linked through the communications network 442 to the clients 443a-n. The environment 440 may be used to allow the clients 443a-n, alone or in combination with the server 441, to execute any of the methods (e.g., 100) described herein.

Embodiments or aspects thereof may be implemented in the form of hardware, firmware, or software. If implemented in software, the software may be stored on any non-transient computer readable medium that is configured to enable a processor to load the software or subsets of instructions thereof. The processor then executes the instructions and is configured to operate or cause an apparatus to operate in a manner as described herein.

Further, firmware, software, routines, or instructions may be described herein as performing certain actions and/or functions of the data processors. However, it should be appreciated that such descriptions contained herein are merely for convenience and that such actions in fact result from computing devices, processors, controllers, or other devices executing the firmware, software, routines, instructions, etc.

It should be understood that the flow diagrams, block diagrams, and network diagrams may include more or fewer elements, be arranged differently, or be represented differently. But it further should be understood that certain implementations may dictate the block and network diagrams and the number of block and network diagrams illustrating the execution of the embodiments be implemented in a particular way.

Accordingly, further embodiments may also be implemented in a variety of computer architectures, physical, virtual, cloud computers, and/or some combination thereof, and thus, the data processors described herein are intended for purposes of illustration only and not as a limitation of the embodiments.

While this invention has been particularly shown and described with references to example embodiments thereof, it will be understood by those skilled in the art that various changes in form and details may be made therein without departing from the scope of the invention encompassed by the appended claims.

What is claimed is:

1. A computer implemented method of modifying a computer aided design (CAD) model, the method comprising:
by a processor, associating metadata with a CAD model in memory communicatively coupled to the processor; and
defining the metadata, including providing the metadata in form of a signal, wherein one or more frequency characteristics of the signal correspond to one or more respective characteristics of the CAD model.

2. The method of claim 1 wherein the CAD model represents a plurality of real-world objects and wherein the one or more frequency characteristics of the signal correspond to the plurality of real-world objects.

3. The method of claim 1 wherein the one or more frequency characteristics of the signal are unique to each respective characteristic of the CAD model.

4. The method of claim 1 further comprising:
storing, in a database coupled to the processor, a mapping between the one or more frequency characteristics of the signal and the corresponding one or more characteristics of the CAD model.

5. The method of claim 1 wherein the one or more frequency characteristics of the signal correspond to one or more respective unknown characteristics of the CAD model.

6. The method of claim 1 wherein the one or more characteristics of the CAD model comprise at least one of:
an object type;
an object material;
an object size;
an object location;
an object orientation;
an object sub-component; and
a sub-system comprising an object.

7. The method of claim 1 further comprising:
receiving search input from a user, the search input representative of a desired frequency; and
by the processor, searching based on the desired frequency to identify a given characteristic of the one or more characteristics of the CAD model.

8. A computer system for modifying a computer aided design (CAD) model, the computer system comprising:
a processor; and
a memory with computer code instructions stored thereon, the processor and the memory, with the computer code instructions, being configured to cause the system to:
associate metadata with a CAD model in the memory; and
define the metadata, including providing the metadata in form of a signal, wherein one or more frequency characteristics of the signal correspond to one or more respective characteristics of the CAD model.

9. The computer system of claim 8 wherein the CAD model represents a plurality of real-world objects and wherein the one or more frequency characteristics of the signal correspond to the plurality of real-world objects.

10. The computer system of claim 8 wherein the one or more frequency characteristics of the signal are unique to each respective characteristic of the CAD model.

11. The computer system of claim 8 wherein the processor and the memory, with the computer code instructions are further configured to cause the system to:

store, in a database communicatively coupled to the processor, a mapping between the one or more frequency characteristics of the signal and the corresponding one or more characteristics of the CAD model.

12. The computer system of claim 8 wherein the one or more frequency characteristics of the signal correspond to one or more respective unknown characteristics of the CAD model.

13. The computer system of claim 8 wherein the one or more characteristics of the CAD model comprise at least one of:
   an object type;
   an object material;
   an object size;
   an object location;
   an object orientation;
   an object sub-component; and
   a sub-system comprising an object.

14. The computer system of claim 8 wherein the processor and the memory, with the computer code instructions, are further configured to cause the system to implement:
   based on a desired frequency input by a user, searching via the desired frequency to identify a given characteristic of the one or more characteristics of the CAD model.

15. A computer program product for modifying a computer aided design (CAD) model, the computer program product executed by a server in communication across a network with one or more clients and comprising:
   a non-transitory computer readable medium, the computer readable medium comprising program instructions which, when executed by a processor causes the processor to:
      associate metadata with a CAD model in memory communicatively coupled to the processor; and
      define the metadata, including providing the metadata in form of a signal, wherein one or more frequency characteristics of the signal correspond to one or more respective characteristics of the CAD model.

16. The computer program product of claim 15 wherein the CAD model represents a plurality of real-world objects and wherein the one or more frequency characteristics of the signal correspond to the plurality of real-world objects.

17. The computer program product of claim 15 wherein the one or more frequency characteristics of the signal are unique to each respective characteristic of the CAD model.

18. The computer program product of claim 15 wherein the computer readable medium comprises program instructions which, when executed by the processor, further causes the processor to:
   store, in a database coupled to the processor, a mapping between the one or more frequency characteristics of the signal and the corresponding one or more characteristics of the CAD model.

19. The computer program product of claim 15 wherein the one or more frequency characteristics of the signal correspond to one or more respective unknown characteristics of the CAD model.

20. The computer program product of claim 15 wherein the one or more characteristics of the CAD model comprise at least one of:
   an object type;
   an object material;
   an object size;
   an object location;
   an object orientation;
   an object sub-component; and
   a sub-system comprising an object.

* * * * *